United States Patent
Livesay et al.

(10) Patent No.: US 7,372,052 B2
(45) Date of Patent: *May 13, 2008

(54) ELECTRON BEAM METHOD AND APPARATUS FOR REDUCING OR PATTERNING THE BIREFRINGENCE OF HALOGENATED OPTICAL MATERIALS

(75) Inventors: William R. Livesay, San Diego, CA (US); Scott M. Zimmerman, Baskin Ridge, NJ (US)

(73) Assignee: C-Beam & Light, Inc., San Diego, CA (US)

( * ) Notice: Subject to any disclaimer, the term of this patent is extended or adjusted under 35 U.S.C. 154(b) by 247 days.

This patent is subject to a terminal disclaimer.

(21) Appl. No.: 11/242,469

(22) Filed: Oct. 3, 2005

(65) Prior Publication Data

US 2006/0071176 A1 Apr. 6, 2006

Related U.S. Application Data

(63) Continuation-in-part of application No. 10/183,784, filed on Jun. 27, 2002, now Pat. No. 7,026,634.

(60) Provisional application No. 60/302,152, filed on Jun. 28, 2001.

(51) Int. Cl.
*A61N 5/00* (2006.01)
*G21G 5/00* (2006.01)

(52) U.S. Cl. ............... 250/492.3; 250/492.1; 250/492.2; 438/31; 438/32; 427/542

(58) Field of Classification Search ............ 250/492.1, 250/492.2, 492.3; 438/31, 32; 427/542
See application file for complete search history.

(56) References Cited

U.S. PATENT DOCUMENTS

| | | | |
|---|---|---|---|
| 5,003,178 A | 3/1991 | Livesay | |
| 5,572,619 A | 11/1996 | Maruo et al. | |
| 6,132,814 A | 10/2000 | Livesay et al. | |
| 6,607,991 B1 * | 8/2003 | Livesay et al. | 438/787 |
| 7,026,634 B2 * | 4/2006 | Livesay et al. | 250/492.3 |

* cited by examiner

*Primary Examiner*—Jack Berman
*Assistant Examiner*—Meenakshi S Sahu
(74) *Attorney, Agent, or Firm*—William Propp, Esq.

(57) ABSTRACT

A controlled electron beam and heat will decrease the birefringence of a halogenated optical material under tensile stress. The electron beam and heat irradiation will occur in a chamber under near vacuum conditions. After electron beam irradiation and heating, the crystalline structure of the halogenated optical material layer has been randomized and made amorphous. The electron beam irradiation and heating will lower the high index of refraction of the halogenated optical material under stress and raise the low index of refraction of the halogenated optical material under stress. The differences in index of refraction between the high index of refraction area of and the low index of refraction area decrease which decreases the birefringence of the halogenated optical material under stress.

23 Claims, 6 Drawing Sheets

ELECTRON BEAM METHOD AND APPARATUS FOR REDUCING OR PATTERNING THE BIREFRINGENCE OF HALOGENATED OPTICAL MATERIALS

This Application is a Continuation-In-Part of U.S. patent application Ser. No. 10/183,784 titled "Method and Apparatus for Forming Optical Materials and Devices" filed on Jun. 27, 2002, which claims the benefit of U.S. PROVISIONAL APPLICATION No. 60/302,152 titled "Novel Optical Materials Formed Using Electron Beam Irradiation and Method for Forming Optical Devices" filed on Jun. 28, 2001.

BACKGROUND OF THE INVENTION

The present invention relates generally to the fabrication of optical materials by electron beam radiation and more specifically to an apparatus and method for fabricating optical devices with a decreased birefringence while under tensile stress or a patterned birefringence under tensile stress utilizing electron beam radiation.

An optical material, which has two different indexes of refraction in two different directions, will divide an incident light beam into two light beams, an ordinary ray and an extraordinary ray. The ordinary ray and the extraordinary ray are in different polarization states but not cross-polarized. This optical property is called birefringence.

Halogenated optical materials are chemical compounds or chemical mixtures that contain halogen atoms, such as fluorine (F), chlorine (Cl), bromine (Br), and iodine (I).

Halogenated optical materials typically have a single, uniform index of refraction. Halogenated optical materials also have a crystalline structure.

When halogenated optical materials are stretched or otherwise placed under tensile stress, the halogenated optical material is birefringent. The halogenated optical material under stress forms a high index of refraction area in one direction and a low index of refraction area in a second direction. The high index of refraction of the halogenated optical material under stress is higher than the normal index of refraction of the halogenated optical material not under stress. The low index of refraction of the halogenated optical material under stress is lower than the normal index of refraction of the halogenated optical material not under stress.

The difference in indexes of refraction between the high index of refraction and the low index of refraction in the halogenated optical material under stress is what causes the birefringence.

It is an object of the present invention to provide an electron beam irradiation method and apparatus to decrease and pattern the birefringence of halogenated optical materials under tensile stress.

SUMMARY OF THE INVENTION

The starting halogenated optical material is deposited on a substrate. The starting halogenated optical material is under tensile stress. The starting halogenated optical material is then exposed with the electron beam at an energy and dose, while the starting halogenated optical material is heated to the appropriate temperature, to decrease the birefringence of the halogenated optical material under stress or to pattern the birefringence of the halogenated optical material under stress. The optical material and substrate are preferably loaded into a vacuum chamber with a flood electron source to expose the upper surface of the substrate and a heating element to apply heat to the lower surface of the substrate. The method utilizes a large area electron beam exposure system in a soft vacuum environment. By adjusting the process conditions, such as electron beam total dose and energy, temperature of the selected optical material, and ambient atmosphere (devoid of oxygen), the birefringence of the halogenated optical material under stress can be altered.

The electron beam imparts sufficient energy to the chemical bonds within the optical material to create scissions, which leads to the formation of additional networking bonds as these bonds recombine within the material. The decrease in birefringence is due to the process of scission and reformation within the optical material.

Halogenated optical materials typically have a single, uniform index of refraction. Halogenated optical materials also have a crystalline structure. When halogenated optical materials are stretched or placed under tensile stress, the halogenated optical material is birefringent. The halogenated optical material under stress forms a high index of refraction area in one direction and a low index of refraction area in a second direction. The difference in indexes of refraction between the high index of refraction and the high index of refraction in the halogenated optical material under stress is what causes the birefringence.

After electron beam irradiation and heating, the crystalline structure of the halogenated optical material layer has been randomized and made amorphous. The electron beam irradiation and heating will lower the high index of refraction of the halogenated optical material under stress and raise the low index of refraction of the halogenated optical material under stress. The differences in index of refraction between the high index of refraction area of and the low index of refraction area decrease which decreases the birefringence of the halogenated optical material under stress. The electron beam irradiation and heating can reduce the differences in index of refraction between the high index of refraction area of and the low index of refraction area until both areas have the same index of refraction eliminating the birefringence of the halogenated optical material under stress.

The halogenated optical material under stress can be patterned with an apertured mask or an embossing structure by the electron beam irradiation and heating so that, under tensile stress, the halogenated optical material will have birefringent areas and decreased birefringent or non-birefringent areas.

The foregoing has outlined, rather broadly, the preferred feature of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention and that such other structures so not depart from the spirit and scope of the invention is its broadest form.

BRIEF DESCRIPTION OF THE DRAWINGS

Other aspects, features, and advantages of the present invention will become more filly apparent from the following detailed description, the appended claim, and the accompanying drawings in which:

DETAILED DESCRIPTION OF THE INVENTION

Figure 1:
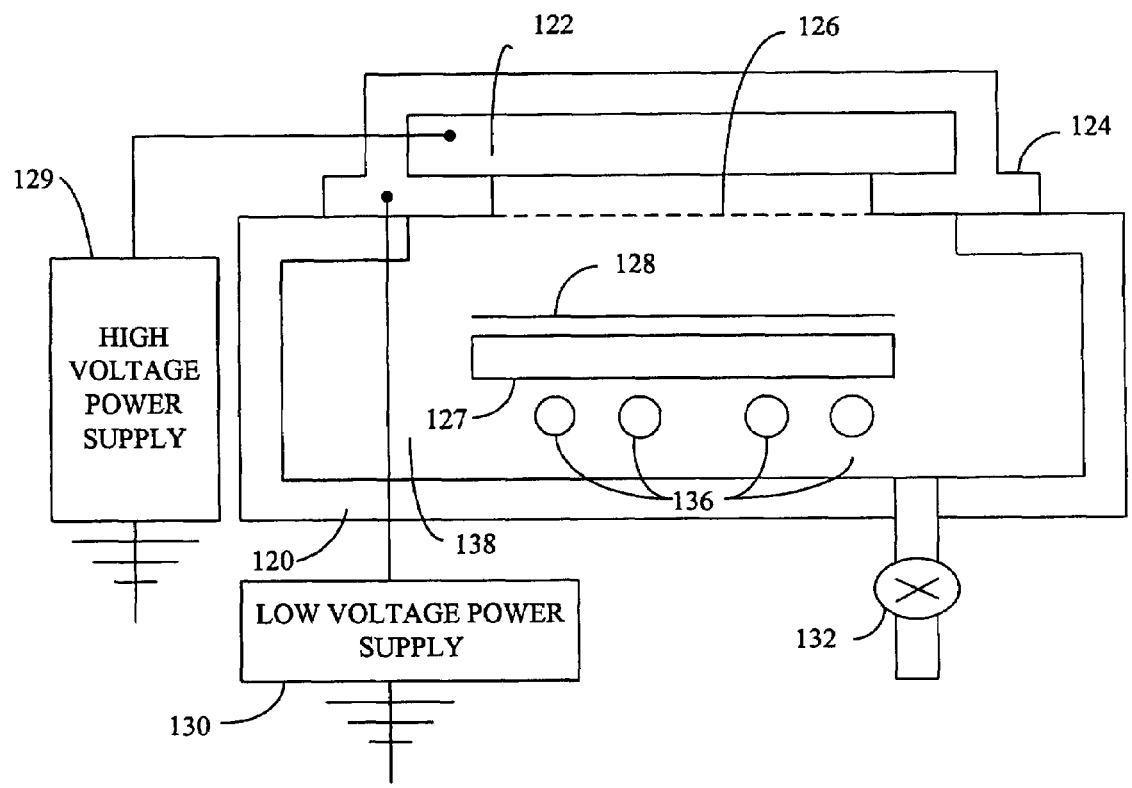
FIG. 1 shows a schematic view of a large area electron beam exposure apparatus.

The exposure of selected optical materials to electron beam irradiation can convert the existing material into a new state, which exhibits more desirable optical and mechanical properties not present in the un-irradiated material. The introduction of extra bonds within solid halogenated optical materials, including polymers, results in decreased birefringence of the halogenated optical material under tensile stress.

The electron beam imparts sufficient energy to the chemical bonds in the optical materials to create scissions, which leads to the formation of additional networking bonds as these reactive entities recombine within the optical material (crosslinking). Starting halogenated optical materials can be converted using this approach. These materials do not outgas significantly in soft vacuum (10-50 millitorr).

Preferred optical materials include the following: Typical spin-on glass materials include methylsiloxane, methylsilsesquioxane, phenylsiloxane, phenylsilsesquioxane, methylphenylsiloxane, methylphenylsilsesquioxane, and silicate polymers. Spin-on glass materials also include hydrogensiloxane polymers of the general formula $(H_{0-1.0}SiO_{1.5-2.0})_x$ and hydrogensilsesquioxane polymers, which have the formula $(HSiO_{1.5})_x$, where x is greater than about 8. Also included are copolymers of hydrogensilsesquioxane and alkoxyhydridosiloxane or hydroxyhydridosiloxane. Spin-on glass materials additionally include organohydridosiloxane polymers of the general formula $(H_{0-1.0}SiO_{1.5-2.0})_n(R_{0-1.0}SiO_{1.5-2.0})_m$, and organohydridosilsesquioxane polymers of the general formula $(HSiO_{1.5})_n(RSiO_{1.5})_m$, where m is greater than 0 and the sum of n and m is greater than about 8 and R is alkyl or aryl.

Typical polymer materials include halogenated polyalkylenes, preferred fluorinated an/or chlorinated polyalkylens, more preferred chlorofluoropolyalkylens, and most preferred are the fluorinated polyalkylenes among which are included: polytetrafluoroethane (ethylene), polytrifluoroethylene, polyvinylidene fluoride, polyvinylfluoride, copolymers of fluorinated ethylene or fluorinated vinyl groups with non-fluorinated ethylenesor vinyl groups, and copolymers of fluorinated ethylenes and vinyls with straight or substituted cyclic fluoroethers containing one or more oxygens in the ring. Also included in the most preferred polymers are poly(fluorinated ethers) in which each linear monomer may contain from one to four carbon atoms between the ether oxygens and these carbons may be perfluorinated, monofluorinated, or not fluorinated.

Also included in the most preferred polymers are copolymers of wholly fluorinated alkylenes with fluorinated ethers, partly fluorinated alkylenes with wholly fluorinated ethers, wholly fluorinated alkylenes with partly fluorinated ethers, partly fluorinated alkylenes with partly fluorinated ethers, non-fluorinated alkylenes with wholly or partly fluorinated ethers, and non-fluorinated ethers with partly or wholly fluorinated alkylenes.

Also included among the most preferred polymers are copolymers of alkylenes and ethers in which one kind of the monomers is wholly or partly substituted with chlorine and the other monomer is substituted with fluorine atoms. In all the above, the chain terminal groups may be similar to those in the chain itself, or different.

Also among the most preferred polymers are included substituted polyacrylates, polymethacrylates, polyitaconates, polymaleates, and polyfumarates, and their copolymers, in which their substituted side chains are linear with 2 to 24 carbon atoms, and their carbon atoms are fully fluorinated except for the first one or two carbons near the carboxyloxygen atom such as Fluoroacrylate, Fluoromethacrylate and Fluoroitaconate.

Among the more preferred polymers, one includes fluoro-substituted polystyrenes, in which the ring may be substituted by one or more fluorine atoms, or alternatively, the polystyrene backbone is substituted by up to 3 fluorine atoms per monomer. The ring substitution may be on ring carbons No. 4, 3, 2, 5, or 6, preferably on carbons No. 4 or 3. There may be up to 5 fluorine atoms substituting each ring.

Among the more preferred polymers, one includes aromatic polycarbonates, poly(ester-carbonates), polyamids and poly(esteramides), and their copolymers in which the aromatic groups are substituted directly by up to four fluorine atoms per ring one by one on more mono or trifluoromethyl groups.

Among the more preferred polymers, are fluoro-substituted poly(amic acids) and their corresponding polyimides, which are obtained by dehydration and ring closure of the precursor poly(amic acids). The fluorine substitution is effected directly on the aromatic ring. Fluoro-substituted copolymers containing fluoro-substituted imide residues together with amide and/or ester residues are included.

Also among the more preferred polymers are parylenes, fluorinated and non-fluorinated poly(arylene ethers), for example the poly(arylene ether) available under the tradename FLARE(™) from AlliedSignal Inc., and the polymeric material obtained from phenyl-ethynylated aromatic monomers and oligomers provided by Dow Chemical Company under the tradename SiLK(™), among other materials.

In all the above, the copolymers may be random or block or mixtures thereof.

Figure 2:
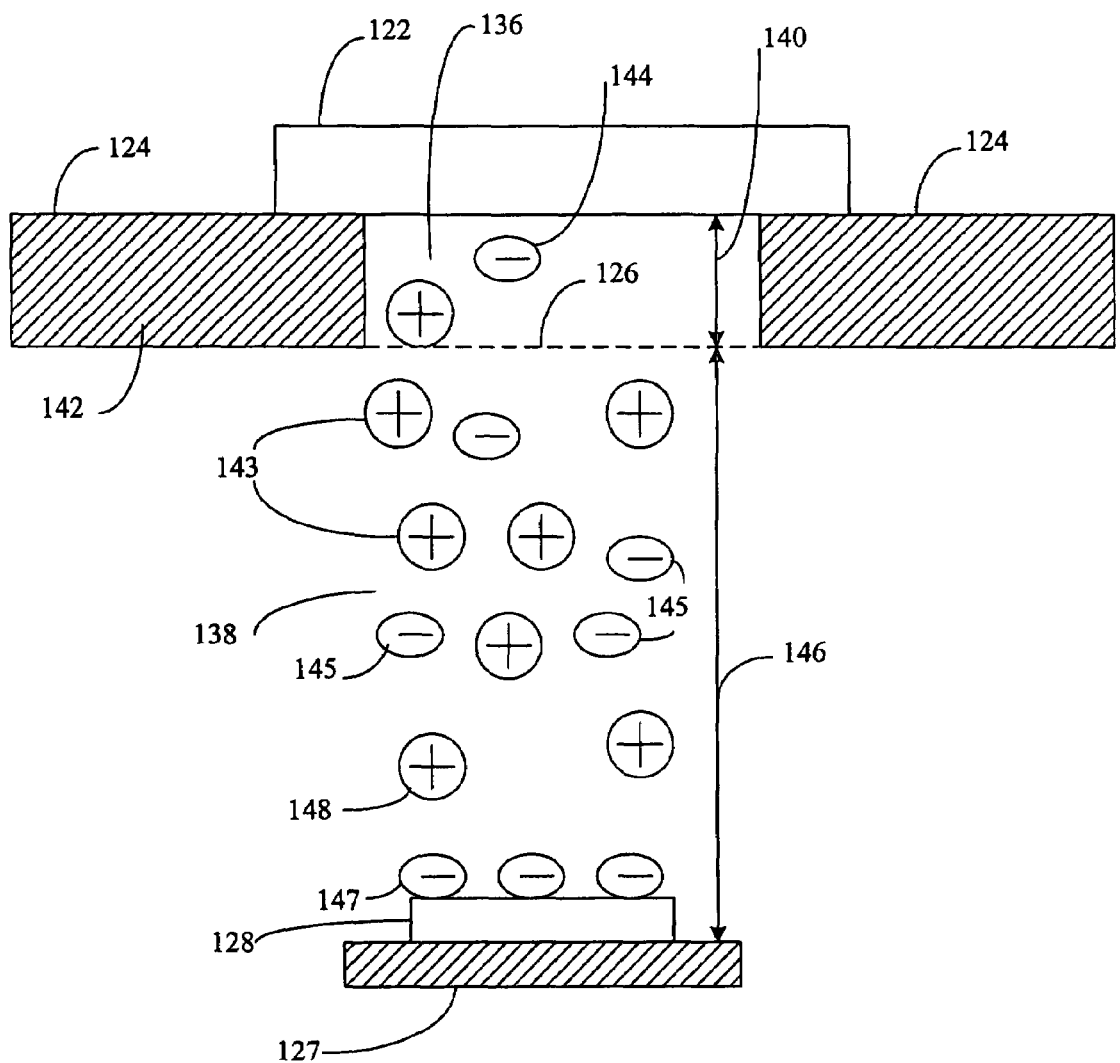
FIG. 2 shows the operation of the electron source.

The method of creating new optical materials from these conventional solid halogenated optical materials, including polymers, according to the present invention, is depicted in FIGS. 1 and 2. A substrate 127 is placed in a vacuum chamber 120 at a pressure of 15-40 milliTorr and underneath an electron source at a distance from the source sufficient for the electrons to generate ions in their transit between the source and the substrate surface. The electrons can be generated from any type of source that will work within a soft vacuum (15-40 milliTorr) environment. A source particularly well suited for this is described in U.S. Pat. No. 5,003,178, the disclosure of which is hereby incorporated into this specification by reference. This is a large uniform and stable source that can operate in a soft vacuum environment. The cathode 122 emits electrons, which are accelerated by the field between the cathode and anode 126. The potential between these two electrodes is generated by the high voltage supply 129 applied to the cathode 122 and the bias voltage supply 130 applied to the anode 126. The electrons irradiate the starting optical material layer 128 coated on the substrate 127. The starting optical material layer 128 may be any of the halogenated optical materials previously mentioned. An electron energy is selected to either fully penetrate or partially penetrate the full thickness of starting halogenated optical material layer 128. For example, an electron beam energy of 9 keV is used to penetrate a 6000 angstrom thick film. Infrared quartz lamps 136 irradiate the bottom side of the substrate providing heating independent from the electron beam. A variable leak valve or mass flow controller, identified by reference 132, is utilized to leak in a suitable gas to maintain the soft vacuum environment.

Referring to FIG. 2, electrons 145 traversing the distance 146 between the anode 126 and the substrate 127 ionize the gas molecules located in region 138 generating positive ions. These positive ions 143 are then attracted back to the anode 126 where they can be accelerated, as indicated at 142, toward the cathode to generate more electrons. The starting optical material layer 128 on the substrate 127 is an insulator and will begin to charge negatively, as indicated at 147, under electron bombardment. However, the positive ions near the substrate surface will be attracted to this negative charge and will then neutralize it. The IR quartz lamps 136 (FIG. 1) irradiate and heat the starting optical material layer or substrate thereby controlling its temperature. Since the starting optical material layer is in a vacuum environment and thermally isolated, the starting optical material layer can be heated or cooled by radiation. If the lamps are extinguished, the starting optical material layer will radiate away its heat to the surrounding surfaces and gently cool. In one embodiment of the invention, the starting optical material layer is simultaneously heated by the infrared lamps and irradiated by the electron beam throughout the entire process.

In the present method, a halogenated optical material is deposited on substrate 127 by conventional means such as spin-coating or, alternatively, spray-coating or dip-coating to form starting optical material layer 128. Substrate 127 can represent any layer or stack of layers on a multiple-optical layer device. The coated substrate is continuously irradiated with electrons until a sufficient dose has accumulated to attain the desired change in the material and affect certain properties such as birefringence. A total dose of between 10 and 100,000 microCoulombs per square centimeter ($\mu C/cm^2$) may be used. Preferably, a dose of between 100 and 10,000 $\mu C/cm^2$ is used, and most preferably a dose of between about 2,000 and 5,000 $\mu C/cm^2$ is used. The dose, however, can be as little as 1 microCoulomb if the electron beam is irradiating a very thin film, e.g. one nanometer. The electron beam is delivered at an energy of between 0.1 and 100 keV, preferably at an energy between 0.5 and 20 keV, and most preferably at an energy between 1 and 10 keV. The electron beam current ranges between 0.1 and 100 mA, and more preferably between 0.25 and 30 mA. The entire electron dose may be delivered at a single voltage.

Alternatively, particularly for starting optical material layer thicker than about 0.25 µm, the dose is divided into steps of decreasing voltage, which provides a "uniform dose" process in which the starting optical material layer is irradiated from the bottom up. The higher energy electrons penetrate deeper into the starting optical material layer. In this way, the depth of electron beam penetration is varied during the electron exposure process resulting in a uniform energy distribution throughout the starting optical material layer. The variation allows for volatile components, such as solvent residues, to leave the film without causing any damage such as pinholes or cracks. This also attains uniformity throughout the layer exposed. Alternatively, the electron energy can be varied to achieve a precise dose and index change spatially within the starting optical material layer.

During the electron beam exposure process, the starting halogenated optical material layer is kept at a temperature between 10 degrees Celsius and 1000 degrees Celsius. Preferably, the wafer temperature is between 30 degrees Celsius and 500 degrees Celsius. For some waxes and other low melting point materials low temperatures are utilized (25 degrees to 175 degrees Celsius). The infrared quartz lamps 36 are on continuously until the starting optical material layer temperature reaches the desired process temperature. The lamps are turned off and on at varying duty cycle to control the starting optical material layer temperature.

Typical background process gases in the soft vacuum environment include nitrogen, argon, oxygen, ammonia, forming gas, helium, methane, hydrogen, silane, and mixtures thereof. For many starting halogenated optical materials, a non-oxidizing processing atmosphere is used. In addition to a near vacuum ambient atmosphere devoid of oxygen, the electron beam irradiation of the starting halogenated optical material and the heating of the starting halogenated optical material above the melt point will de-gas oxygen from the starting halogenated optical material. The degassing of oxygen increases the ratio of crosslinking to change scission under electron beam bombardment of halogenated optical materials.

The optimal choice of electron beam dose, energy, current, processing temperature, and process gas depends on the composition of the starting halogenated optical material.

The optical starting material may be deposited onto a suitable substrate. Typical substrates include glass, silicon, metal, and polymer films. Substrates can also be porous, textured or embossed. Deposition on substrates may be conducted via conventional spin coating, dip coating, roller coating, spraying, embossing, chemical vapor deposition methods, or meniscus coating methods, which are well known in the art. Spin coating on substrates is most preferred. Multiple layers of different materials are also preferred. Layer thicknesses typically range from 0.01 to 20 microns. 1 to 10 microns is preferred. In another embodiment of the invention, the optical starting material is formed into a supported layer similar to pellicles used in semiconductor applications. In this case, layers may be formed by casting, spin coating, and dip coating, lifted off the substrate and attached to a frame for handling. In addition, extruded layers can be attached to a frame, all of which are well known in the art. Casting, with lift-off and frame attachment is preferred. Single layers exhibit thicknesses ranging from 1 micron to 10 microns. Multiple layers of different materials are also possible. Once the article has been formed, the exposure equipment needs to be selected.

Exposure of the material can be done with any type of low energy electron source, preferably in the range of 1 to 50 keV. Soft vacuum (15-40 millitorr) is also preferred for removal of volatiles and usage of low keV electrons. In the preferred embodiment of this invention, the optically useful material, either on a substrate or as supported layer, is selectively exposed to the electron beam and heated using the IR lamps. Selective heating is also preferred. The IR lamps typically operate from room temperature to 400 degrees Celsius. Most materials exhibit different e-beam irradiation responses depending on the temperature of the material. In addition, post annealing can eliminate charge gradients in electrodes formed during irradiation. Other functions such as transmission loss, polarization sensitivity, and back reflections can all be monitored during exposure and used in a feedback loop to the exposure parameters. In-situ feedback during exposure is an embodiment of this invention. Various gases can be introduced during the irradiation process. It has been shown that these gases can be reacted into the starting optical material layer depending on the material and exposure conditions. Introduction of a reactive or non-reactive gas into the starting optical material layer during exposure is a further embodiment of this invention. Radial exposure conditions, as well as other non-flat configurations, are embodiments of this invention as well as modification of the electron field using external means such as magnetic fields. Once the equipment is selected, the exposure conditions are selected.

Typically the starting optical material layer is exposed to a sequential series of kinetic energies generating a particular distribution of bond densities within the optically useful material. Based on the material's particular e-beam response, temperature distribution within the material, kinetic energy distribution of the electrons, and density of the material, a range of new material states can be generated. These new material states exhibit properties not available in the un-irradiated state. Preferred property changes include decreasing or eliminating the birefringence of the halogenated optical material under stress or patterning the birefringence of the halogenated optical material under stress. Exposure can be done through an aperture mask above the starting halogenated optical material as known in the art or through an embossing structure directly on the starting halogenated optical material. Dual sided processing can be used. The mask can be either sacrificial or permanent depending on the application. Once the sample is exposed, fabrication can commence.

Figure 3A:
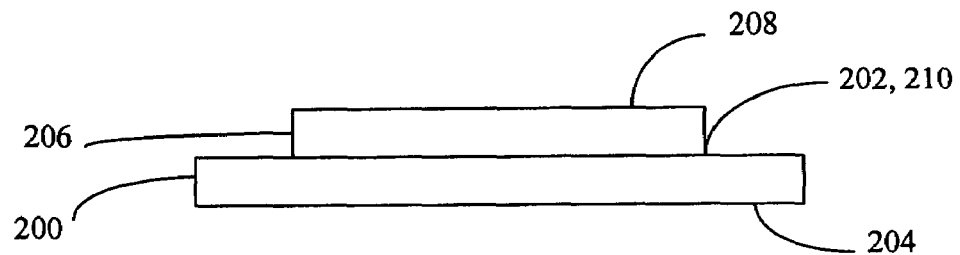
FIG. 3 shows in FIGS. 3A, 3B, and 3C schematic views decreasing the birefringence of a halogenated optical material under tensile stress by electron beam irradiation.

As shown in FIG. 3A, the substrate 200 has an upper surface 202 and a lower surface 204. The starting halogenated optical material layer 206 has an upper surface 208 and a lower surface 210 and is a solid material. The starting halogenated optical material layer 206 will have an original index of refraction $n_0$. The starting halogenated optical material layer 206 is positioned on the substrate 200. The lower surface 210 of the starting halogenated optical material 206 is deposited, bonded, coated, grown or otherwise positioned on the upper surface 202 of the substrate. The starting halogenated optical material will be under tensile stress.

The starting halogenated optical material 206 can be deposited, bonded, coated or grown on the substrate 200 so the starting halogenated optical material is stretched along the length of the optical material layer, placing the starting halogenated optical material layer under tensile stress parallel to its upper and lower surfaces 208 and 210.

The halogenated optical material under stress forms a high index of refraction area in one direction and a low index of refraction area in a second direction. The high index of refraction $n_1$ of the halogenated optical material under stress is higher than the normal index of refraction $n_0$ of the halogenated optical material not under stress. The low index of refraction $n_2$ of the halogenated optical material under stress is lower than the normal index of refraction $n_0$ of the halogenated optical material not under stress. The difference in indexes of refraction between the high index of refraction and the high index of refraction in the halogenated optical material under stress is what causes the birefringence of the halogenated optical material under stress.

Alternately, the starting halogenated optical material layer 206 can be stretched to place the starting optical material under tensile stress before it is positioned on the substrate. Mechanical or electromechanical means known to those of ordinary skill in the art can be used to place the starting halogenated optical material under tensile stress. The starting halogenated optical material layer while still under tensile stress is removed from the mechanical or electromechanical stretching means and positioned on the substrate by deposition, bonding, coating, or growth.

Alternately, the mechanical or electromechanical stretching means can be part of the electron beam apparatus inside the chamber to stretch the starting halogenated optical material layer on the substrate placing the starting optical material under tensile stress during electron beam irradiation and heating.

Figure 3B:
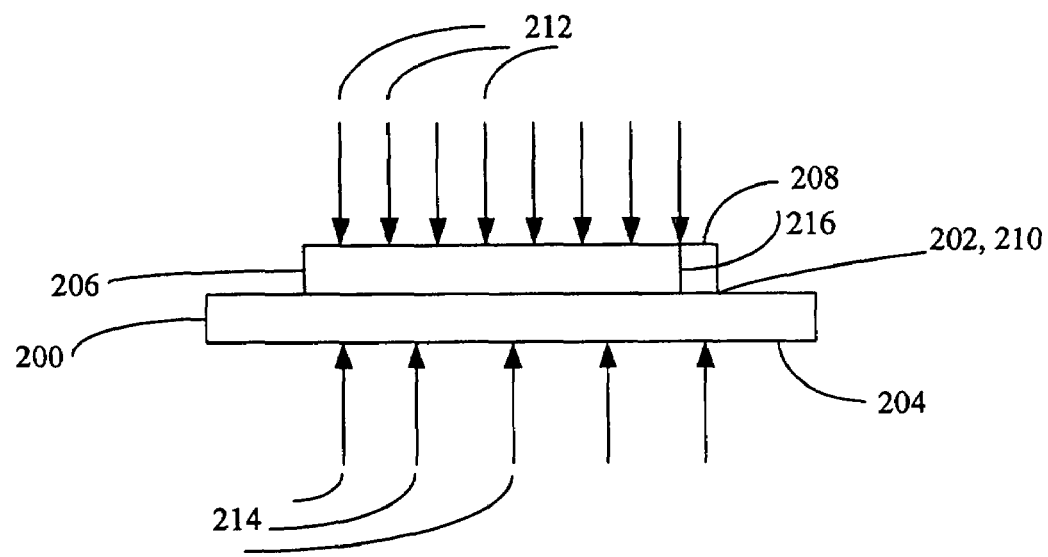

As shown in FIG. 3B, a large area electron beam 212 is incident at a perpendicular angle to the upper surface 208 of the starting halogenated optical material layer 206 under tensile stress and irradiates the optical material layer under tensile stress. The depth of the penetrating electron beam and the resulting thickness of the altered refractive index layer are determined by the dose, voltage and duration of the electron beam and accordingly can vary from the upper surface of the starting halogenated optical material layer to the lower surface. The angle of incidence of the electron beam irradiation can vary from the perpendicular to the optical material layer.

Infrared radiation beams 214 will heat the substrate 200 through the lower surface 204 and, by heat transfer through the substrate, will heat the starting halogenated optical material 206. The electron beam 212 fully penetrates the depth or thickness 216 of the halogenated optical material layer under tensile stress between the upper surface 208 and the lower surface 210 of the halogenated optical material layer 206.

Figure 3C:

As shown in FIG. 3C, the entire halogenated optical material layer 206 under tensile stress, after electron beam irradiation and heating, will have its birefringence lowered. The electron beam imparts sufficient energy to the chemical bonds in the optical materials to create scissions, which leads to the formation of additional networking bonds as these reactive entities recombine within the optical material The introduction of extra bonds within solid halogenated optical materials, including polymers, results in decreased birefringence of the halogenated optical material under tensile stress. The electron beam irradiation and heating will lower the high index of refraction of the halogenated optical material under tensile stress and raise the low index of refraction of the halogenated optical material under tensile stress. The differences in index of refraction between the high index of refraction area of and the low index of refraction area decrease which decreases the birefringence of the halogenated optical material under tensile stress.

The electron beam irradiation and heating can reduce the differences in index of refraction between the high index of refraction area and the low index of refraction area until both areas have the same index of refraction eliminating the birefringence of the halogenated optical material under tensile stress.

The halogenated optical material layer can be removed from the substrate by conventional chemical, etching or physical means. Alternately, a release layer can be deposited on the substrate and the starting halogenated optical material layer can be deposited on the release layer. The electron beam radiation and heat radiation will pass through the release layer without effecting the release layer or the transformation of the starting halogenated optical material layer. After the transformation process, the halogenated optical material layer can be lifted off the substrate by dissolving the release layer.

The halogenated optical material layer can be removed from tensile stress and returned to a non-birefringent state. If the halogenated optical material layer is placed under tensile stress subsequently, its birefringence is lowered or eliminated.

The electron beam apparatus and method can provide a layer of one decreased birefringence or non-birefringence integral and adjacent to a layer of birefringence with both layers under tensile stress and formed of the same optical material.

Figure 4A:
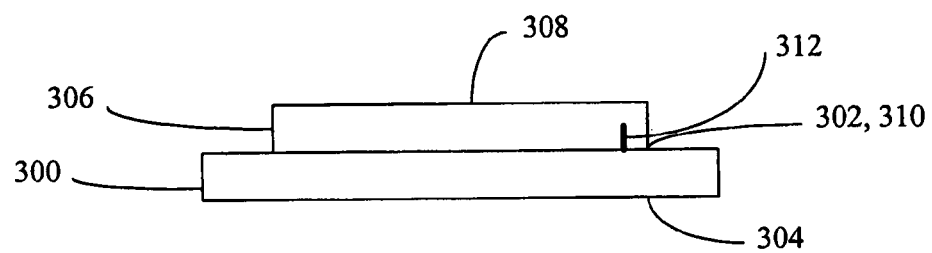
FIG. 4 shows in FIGS. 4A, 4B, and 4C schematic views decreasing the birefringence of a sub-layer of a halogenated optical material under tensile stress by electron beam irradiation

As shown in FIG. 4A, the substrate 300 has an upper surface 302 and a lower surface 304. The starting halogenated optical material layer 306 has an upper surface 308 and a lower surface 310. The lower surface 310 of the starting halogenated optical material layer is deposited, bonded, coated, or otherwise positioned on the upper surface 302 of the substrate. The starting halogenated optical material layer 306 will have an original index of refraction $n_0$ and a thickness 312. The starting halogenated optical material layer 306 is under tensile stress.

Figure 4B:
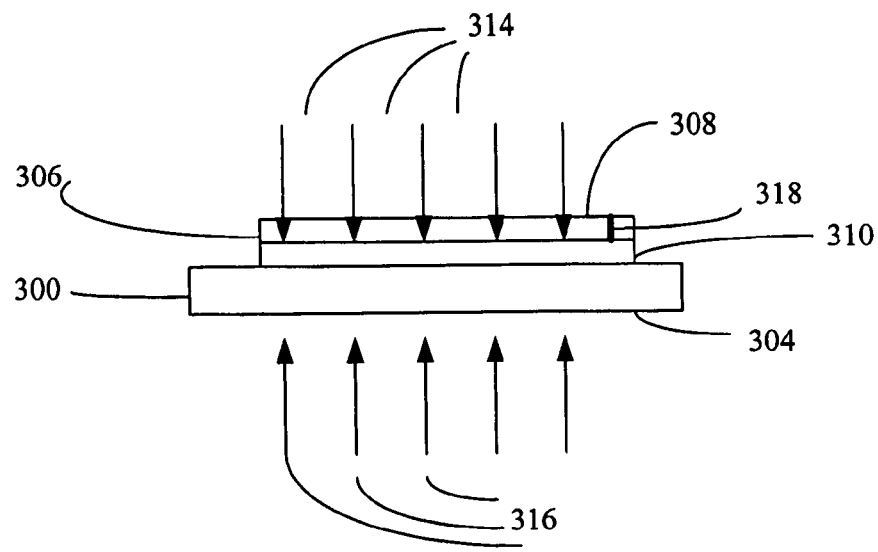

As shown in FIG. 4B, a large area electron beam 314 is incident at a perpendicular angle to the upper surface 308 of the halogenated optical material layer 306 under tensile stress and irradiates the halogenated optical material layer under tensile stress. Infrared radiation beams 316 will heat the substrate 300 through the lower surface 304 and, by heat transfer through the substrate, will heat the starting halogenated optical material layer 306. The electron beam 314 partially penetrates the halogenated optical material layer to a depth or thickness 318 from the upper surface 308 between the upper surface 308 and the lower surface 310 of the halogenated optical material layer. The penetration depth 318 is less than the thickness 312 of the halogenated optical material layer.

Figure 4C:
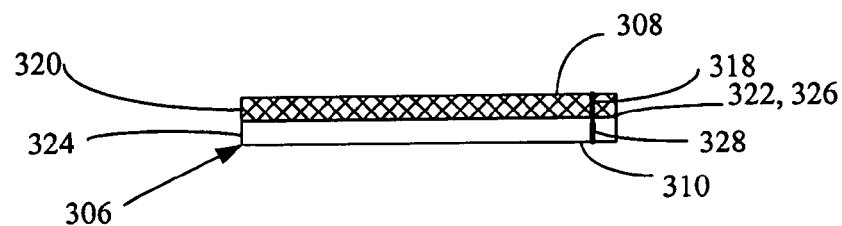

As shown in FIG. 4C, the partial penetration of the electron beam irradiation divides the optical material into a first sub-layer and a second sub-layer. The optical material layer 306 has a first or upper sub-layer 320 having an upper surface 308 and a lower surface 322 and a second or lower sub-layer 324 having an upper surface 326 and a lower surface 310. The lower surface 322 of the upper sub-layer is on the upper surface 326 of the lower sub-layer. The lower surface 310 of the lower sub-layer is on the upper surface 302 of the substrate. Since the starting halogenated optical material layer is one layer, after electron beam irradiation, the second sub-layer is integral and positioned adjacent and on top of the first sub-layer within the halogenated optical material layer.

As shown in FIG. 4C, after electron beam irradiation and heating, the first or upper optical material sub-layer 320 of the halogenated optical material layer 306 under tensile stress will have its birefringence lowered. The lower surface 322 of the upper sub-layer 320 is at the irradiation penetration depth 318 of the electron beam. The upper sub-layer will have a thickness equivalent to the penetration depth of the electron beam.

The electron beam imparts sufficient energy to the chemical bonds in the optical materials in the second sub-layer to create scissions, which leads to the formation of additional networking bonds as these reactive entities recombine within the optical material. The introduction of extra bonds within solid halogenated optical materials, including polymers, results in decreased birefringence of the halogenated optical material under tensile stress. The electron beam irradiation and heating will lower the high index of refraction of the halogenated optical material under tensile stress and raise the low index of refraction of the halogenated optical material under tensile stress. The differences in index of refraction between the high index of refraction area of and the low index of refraction area decrease which decreases the birefringence of the first or upper sub-layer of the halogenated optical material under tensile stress.

The electron beam irradiation and heating can reduce the differences in index of refraction between the high index of refraction area of and the low index of refraction area until both areas have the same index of refraction eliminating the birefringence of the first or upper sub-layer of the halogenated optical material under tensile stress.

The second or lower optical material sub-layer 324 of the halogenated optical material layer 306 under tensile stress, which was not exposed to the electron beam irradiation, will have the original birefringence of the starting optical material layer. The lower sub-layer will have a thickness 328 equivalent to the original thickness 312 of the starting optical material less the thickness 318 of the upper sub-layer.

Since the starting halogenated optical material layer is one layer, after electron beam irradiation, the first sub-layer of decreased birefringence or non-birefringence is integral and positioned adjacent to the second sub-layer of birefringence within the halogenated optical material layer.

The halogenated optical material layer under tensile stress will have adjacent sub-layers of different birefringence but formed from the same halogenated optical material.

The halogenated optical material layer under tensile stress will have adjacent sub-layers of different birefringence without fabrication by deposition, without an intervening adhesive layer between the two sub-layers, and with both adjacent sub-layers being formed from the same optical material.

The depth of the penetrating electron beam and the resulting thickness of the altered birefringence layer are determined by the dose, voltage and duration of the electron beam and accordingly can vary from the upper surface of the starting halogenated optical material layer to the lower surface.

The electron beam irradiation and heating can reduce the differences in index of refraction between the high index of refraction area and the low index of refraction area until both areas have the same index of refraction eliminating the birefringence of the second sub-layer halogenated optical material under tensile stress.

The halogenated optical material layer can be removed from the substrate by conventional chemical, etching or physical means. Alternately, a release layer can be deposited on the substrate and the starting halogenated optical material layer can be deposited on the release layer. The electron beam radiation and heat radiation will pass through the release layer without effecting the release layer or the transformation of the starting halogenated optical material layer. After the transformation process, the halogenated optical material layer can be lifted off the substrate by dissolving the release layer.

The halogenated optical material layer can be removed from tensile stress and returned to a non-birefringent state.

If the halogenated optical material layer is placed under tensile stress subsequently, its birefringence is lowered or eliminated.

An aperture mask can be used with the electron beam apparatus and method to provide a birefringence section integral and adjacent to a decreased birefringence or non-birefringence section with both sections formed of the same halogenated optical material. The aperture mask can be used with the electron beam apparatus and method to pattern a birefringence section integral and adjacent to a decreased birefringence or non-birefringence section with both sections formed of the same halogenated optical material.

Figure 5A:
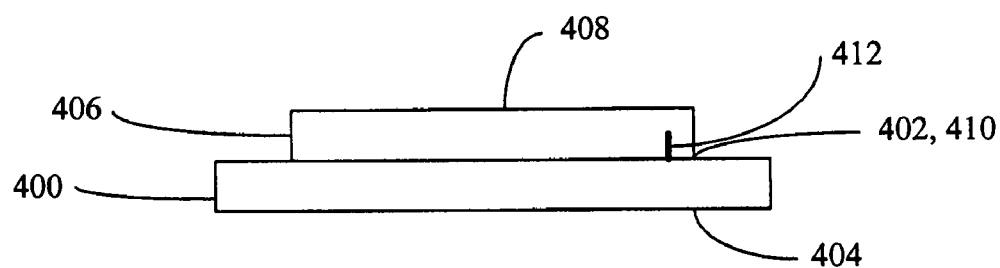
FIG. 5 shows in FIGS. 5A, 5B, 5C, and 5D schematic views of decreasing the birefringence of selected areas of a halogenated optical material under tensile stress by electron beam irradiation through an aperture mask.

As shown in FIG. 5A, the substrate 400 has an upper surface 402 and a lower surface 404. The starting halogenated optical material layer 406 has an upper surface 408 and a lower surface 410. The lower surface 410 of the starting halogenated optical material layer is deposited, bonded, coated, or otherwise positioned on the upper surface 402 of the substrate. The starting halogenated optical material layer 406 will have an original index of refraction $n_0$ and a thickness 412. The starting halogenated optical material layer 406 is under tensile stress.

Figure 5B:
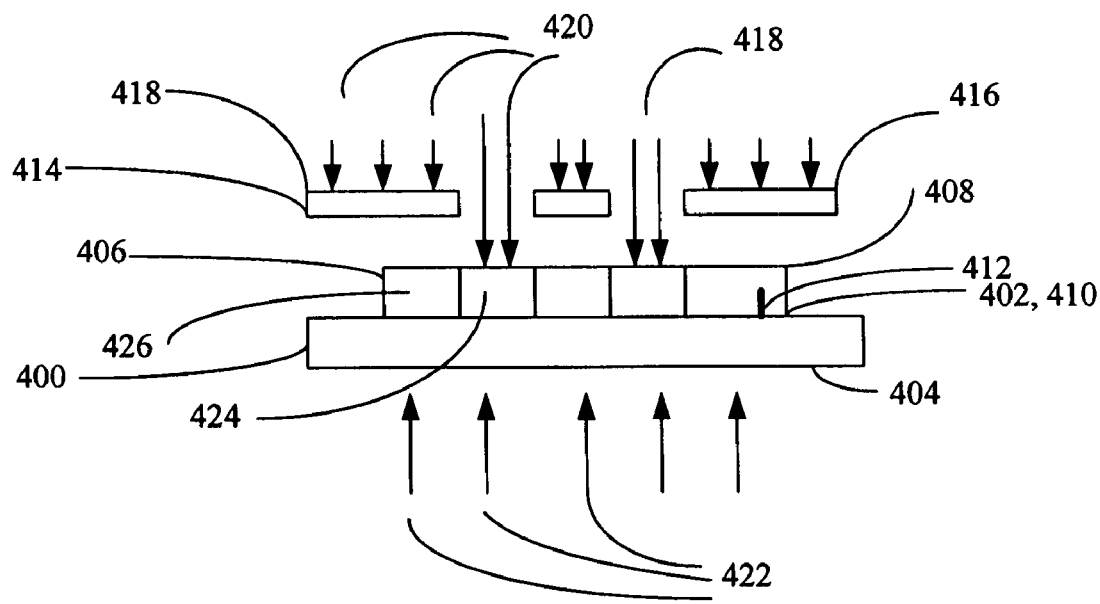

As shown in FIG. 5B, an aperture mask 414 is positioned between the electron beam source (not shown in this Figure) and the starting halogenated optical material layer 406 under tensile stress. The mask 414 has an upper surface 416 and apertures 418.

A large area electron beam 420 is incident at a perpendicular angle to the upper surface 408 of the halogenated optical material layer 406 under tensile stress through the apertures 418 of the mask 414 and irradiates the halogenated optical material layer under tensile stress through the mask apertures 418. The electron beam 420 will be absorbed, or otherwise blocked, by the surface 416 of the mask 414 but will be transmitted through the apertures 418. Infrared radiation beams 422 will heat the substrate 400 through the lower surface 404 and, by heat transfer through the substrate, will heat the starting halogenated optical material 406.

The electron beam 420 fully penetrates the depth or thickness 412 of the halogenated optical material layer 406 under tensile stress to the lower surface 410 of the halogenated optical material layer 406 and the upper surface 402 of the substrate 400 in the first sections 422 of the halogenated optical material layer 406 exposed to the electron beam through the apertures 418. Second sections 424 of the halogenated optical material layer 406 under tensile stress were not exposed to the electron beam 420 because the mask 414 absorbed or blocked the electron beam.

Figure 5C:
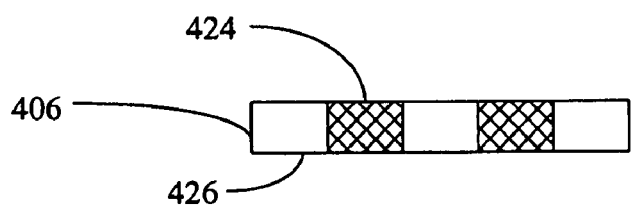

As shown in FIG. 5C, the aperture mask 414 is removed. The halogenated optical material layer 406 is removed from the substrate 400 by conventional chemical, etching, physical means or the use of a release layer, as discussed previously.

After heating and electron beam irradiation through the mask aperture, the first sections 422 of the halogenated optical material layer 406 under tensile stress will have its birefringence lowered. The electron beam imparts sufficient energy to the chemical bonds in the optical materials to create scissions, which leads to the formation of additional networking bonds as these reactive entities recombine within the optical material. The introduction of extra bonds within solid halogenated optical materials, including polymers, results in decreased birefringence of the halogenated optical material under tensile stress. The electron beam irradiation and heating will lower the high index of refraction of the first sections of the halogenated optical material under tensile stress and raise the low index of refraction of the first sections of the halogenated optical material under tensile stress. The differences in index of refraction between the high index of refraction area of and the low index of refraction area decrease in the first sections of the halogenated optical material layer, which decreases the birefringence of the halogenated optical material under tensile stress.

The electron beam irradiation and heating can reduce the differences in index of refraction between the high index of refraction area and the low index of refraction area until both areas in the first sections of the halogenated optical material layer have the same index of refraction eliminating the birefringence in the first sections of the halogenated optical material under tensile stress.

The second sections 424 of the halogenated optical material layer 406 under tensile stress, which was not exposed to the electron beam irradiation, will have the original birefringence of the starting optical material layer. Since the starting halogenated optical material layer is one layer, after electron beam irradiation, the first sections of decreased birefringence or non-birefringence are integral and positioned adjacent to the second sections of birefringence within the halogenated optical material layer.

The mask serves to restrict the electron beam spatially limiting its irradiation to the apertured sections of the halogenated optical material layer.

Figure 5D:
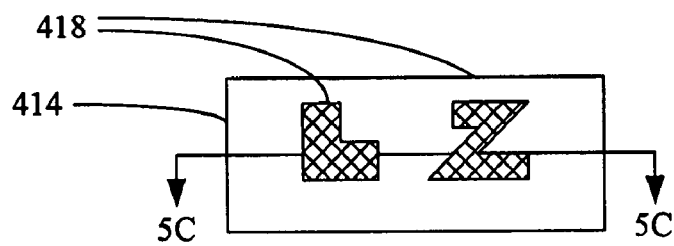

As shown in FIG. 5D, the apertures 418 in the mask 414 can form a pattern. Thus, after electron beam irradiation through the apertures in the mask, the halogenated optical material layer under tensile stress will have a pattern of decreased birefringence or non-birefringence in the birefringent halogenated optical material layer. Conversely, using a mirror or reverse pattern to the apertures in the mask, after electron beam irradiation through the apertures in the mask, the halogenated optical material layer under tensile stress will have a pattern of birefringence in the decreased birefringent or non-birefringent halogenated optical material layer. The patterned birefringence in the halogenated optical material layer under tensile stress has many practical applications including but not limited to identification markings or cards.

By using the mask aperture, the halogenated optical material layer under tensile stress will have adjacent sections of different birefringence but formed from the same halogenated optical material.

By using the mask aperture, the halogenated optical material layer under tensile stress will have adjacent sections of different birefringence without fabrication by deposition, without an intervening adhesive layer between the structure and layer or between adjacent sections, and with both adjacent sections being formed from the same halogenated optical material.

The depth of the penetrating electron beam and the resulting thickness of the altered birefringence layer are determined by the dose, voltage and duration of the electron beam and accordingly can vary from the upper surface of the starting halogenated optical material layer to the lower surface.

The aperture mask 414 of FIG. 5 can be used with the halogenated optical material layer 306 of FIG. 4 to provide a masked or patterned upper sub-layer 320 of decreased birefringence or non-birefringence.

An embossing structure can be used with the electron beam apparatus and method to provide a birefringence section integral and adjacent to a decreased birefringence or non-birefringence section with both sections formed of the same halogenated optical material. The embossing structure can be used with the electron beam apparatus and method to pattern a birefringence section integral and adjacent to a decreased birefringence or non-birefringence section with both sections formed of the same halogenated optical material.

Figure 6A:
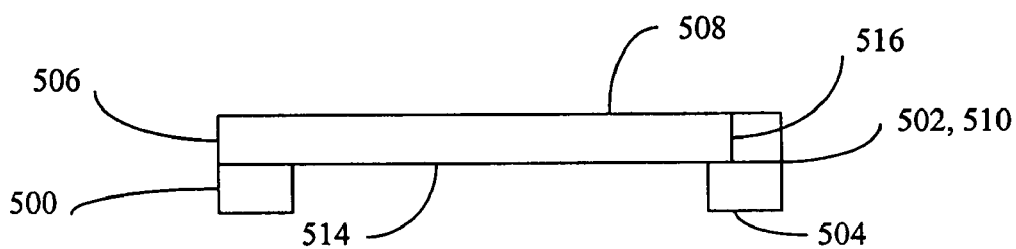
FIG. 6 shows in FIGS. 6A, 6B, 6C, and 6D schematic views of decreasing the birefringence of selected areas of a halogenated optical material under tensile stress by electron beam irradiation through an embossed structure.

As shown in FIG. 6A, the substrate 500 is a support ring with an upper surface 502 and a lower surface 504. The starting halogenated optical material layer 506 has an upper surface 508 and a lower surface 510. A small portion 512 of the lower surface 510 of the starting halogenated optical material layer is deposited, bonded, coated, or otherwise positioned on the upper surface 502 of the substrate support ring. A large portion 514 of the lower surface 510 of the starting halogenated optical material layer remains exposed. The support ring can substitute for a substrate layer in this and other embodiments of the present invention. The starting halogenated optical material layer 506 will have an original index of refraction $n_0$ and a thickness 516. The starting halogenated optical material layer 506 is under tensile stress.

Figure 6B:
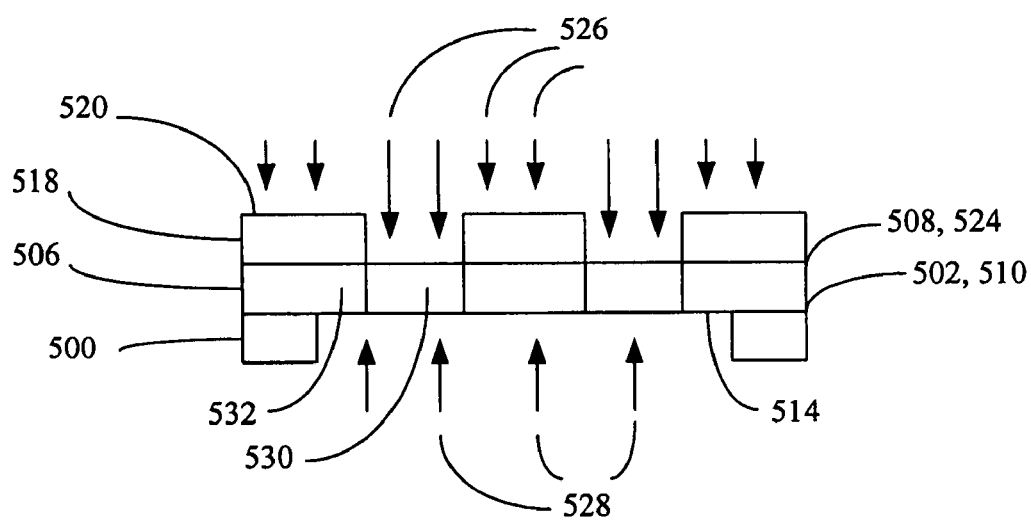
Figure 6C:
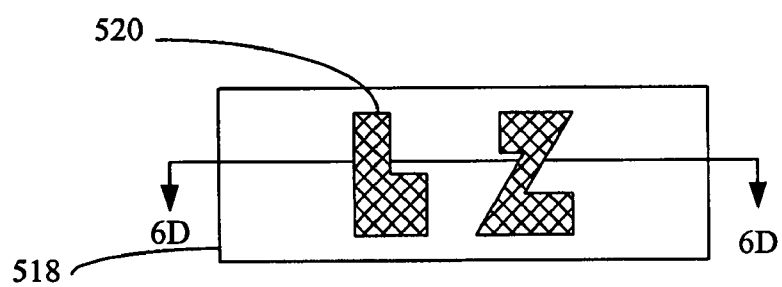

As shown in FIG. 6B, an embossed structure 518 is formed of photoresist or wax has a pattern 520 (in FIG. 6C) on its upper surface 522. Returning to FIG. 6B, the lower surface 524 of the embossed structure 518 is flat and deposited or positioned on the upper surface 508 of the starting halogenated optical material layer 506.

A large area electron beam 526 is incident at a perpendicular angle to the upper surface 522 of the embossed structure 518 and irradiates the embossed structure 518 and the starting halogenated optical material layer 506 under tensile stress. Infrared radiation beams 528 will heat the starting optical material 506 through the exposed portion 514 of the lower surface 510 of the starting halogenated optical material layer 506.

The electron beam 526 fully penetrates the embossed structure 518 and fully penetrates the starting optical material layer 506 under tensile stress through the sections of the pattern 520 to the lower surface 510 of first sections 530 of the halogenated optical material layer 506. Second sections 532 of the halogenated optical material layer 506 under tensile stress were not exposed to the electron beam 526 because the pattern 520 absorbed or blocked the electron beam.

Figure 6D:
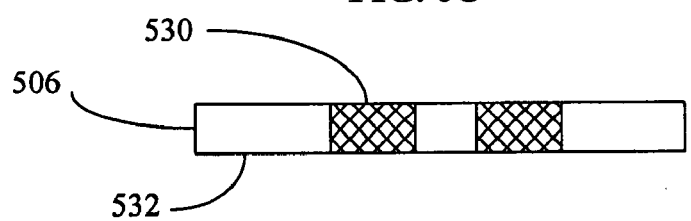

As shown in FIG. 6D, the embossing structure 518 of photoresist is removed by conventional means. The optical material layer 506 is removed from the substrate support rings 500 by conventional chemical, etching, physical means or the use of a release layer, as discussed previously.

After heating and electron beam irradiation through the embossing structure, the first sections 530 of the halogenated optical material layer 506 under tensile stress will have its birefringence lowered. The electron beam imparts sufficient energy to the chemical bonds in the optical materials to create scissions, which leads to the formation of additional networking bonds as these reactive entities recombine within the optical material. The introduction of extra bonds within solid halogenated optical materials, including polymers, results in decreased birefringence of the halogenated optical material under tensile stress. The electron beam irradiation and heating will lower the high index of refraction of the first sections of the halogenated optical material under tensile stress and raise the low index of refraction of the first sections of the halogenated optical material under tensile stress. The differences in index of refraction between the high index of refraction area of and the low index of refraction area decrease in the first sections of the halogenated optical material layer, which decreases the birefringence of the halogenated optical material under tensile stress.

The electron beam irradiation and heating can reduce the differences in index of refraction between the high index of refraction area and the low index of refraction area until both areas in the first sections of the halogenated optical material layer have the same index of refraction eliminating the birefringence in the first sections of the halogenated optical material under tensile stress.

The second sections 532 of the halogenated optical material layer 506 under tensile stress, which was not exposed to the electron beam irradiation, will have the original birefringence of the starting optical material layer. Since the starting halogenated optical material layer is one layer, after electron beam irradiation, the first sections of decreased birefringence or non-birefringence are integral and positioned adjacent to the second sections of birefringence within the halogenated optical material layer.

The embossing structure 518 has a pattern 520 on its upper surface 522 which patterns the birefringence of the halogenated optical material layer. Thus, after electron beam irradiation through the patterned embossing structure, the halogenated optical material layer under tensile stress will have a pattern of decreased birefringence or non-birefringence in the birefringent halogenated optical material layer. Conversely, using a mirror or reverse pattern to the embossing structure, after electron beam irradiation through the pattern, the halogenated optical material layer under tensile stress will have a pattern of birefringence in the decreased birefringent or non-birefringent halogenated optical material layer. The patterned birefringence in the halogenated optical material layer under tensile stress has many practical applications including but not limited to identification markings or cards.

By using the embossing structure, the halogenated optical material layer under tensile stress will have adjacent sections of different birefringence but formed from the same halogenated optical material.

By using the embossing structure, the halogenated optical material layer under tensile stress will have adjacent sections of different birefringence without fabrication by deposition, without an intervening adhesive layer between the structure and layer or between adjacent sections, and with both adjacent sections being formed from the same halogenated optical material.

The depth of the penetrating electron beam and the resulting thickness of the altered birefringence layer are determined by the dose, voltage and duration of the electron beam and accordingly can vary from the upper surface of the starting halogenated optical material layer to the lower surface.

The embossing structure 518 of FIG. 6 can be used with the halogenated optical material layer 306 of FIG. 4 to provide a masked or patterned upper sub-layer 320 of decreased birefringence or non-birefringence.

With the novel method and apparatus described in the present invention, birefringent materials can be altered to impart a three dimensional birefringence profile, which can be used in a number of useful optical components. Potential components which can be fabricated with this method are: compensation films for LCDs, birefringent optical devices for telecommunications, security devices (encoded security marks for currency, ID tags, liquor labels, cigarettes, DVDs, CDs, etc.).

While there has been described herein the principles of the invention, it is to be clearly understood to those skilled in the art that this description is made only by way of example and not as a limitation to the scope of the invention. Accordingly, it is intended, by the appended claims, to cover all modifications of the invention, which fall within the true spirit and scope of the invention.

What is claimed is:

1. An apparatus for decreasing the birefringence of at least one starting halogenated optical material comprising:
   a chamber for providing an exposure atmosphere,
   a support member located within said chamber for supporting at least one starting halogenated optical material under tensile stress;
   a source having a cathode and an anode for providing a large area electron beam within the chamber, said large area electron beam irradiating said at least one starting halogenated optical material under tensile stress, and
   control means to control the large area electron beam to decrease the birefringence of said at least one starting halogenated optical material under tensile stress.

2. The apparatus for decreasing the birefringence of at least one starting halogenated optical material of claim 1 further comprising:
   heating means to raise the temperature of said at least one starting halogenated optical material under tensile stress during said large area electron beam irradiating said at least one starting halogenated optical material under tensile stress.

3. The apparatus for decreasing the birefringence of at least one starting halogenated optical material of claim 2 wherein said heating means is located within said chamber.

4. The apparatus for decreasing the birefringence of at least one starting halogenated optical material of claim 2 wherein said heating means can raise said temperature of said at least one starting halogenated optical material under tensile stress to between 10 degrees Celsius and 1000 degrees Celsius during said large area electron beam irradiating said at least one starting halogenated optical material under tensile stress.

5. The apparatus for decreasing the birefringence of at least one starting halogenated optical material of claim 1 further comprising:
   an aperture mask for limiting said large area electron beam irradiating said at least one starting halogenated optical material under tensile stress to a selected area on said at least one starting optical material under tensile stress.

6. The apparatus for decreasing the birefringence of at least one starting halogenated optical material of claim 5 wherein said aperture mask forms a pattern to the birefringence in said starting halogenated optical material under tensile stress.

7. The apparatus for decreasing the birefringence of at least one starting halogenated optical material of claim 1 further comprising:
   an embossing structure for limiting said large area electron beam irradiating said at least one starting halogenated optical material under tensile stress to a selected area on said at least one starting optical material under tensile stress.

8. The apparatus for decreasing the birefringence of at least one starting halogenated optical material of claim 7 wherein said embossing structure forms a pattern to the birefringence in said starting halogenated optical material under tensile stress.

9. The apparatus for decreasing the birefringence of at least one starting halogenated optical material of claim 1 wherein the atmosphere in said chamber is between 1 milliTorr and 760 milliTorr.

10. The apparatus for decreasing the birefringence of at least one starting halogenated optical material of claim 1 wherein said at least one starting halogenated optical material is a mixture of at least two different halogenated optical materials.

11. The apparatus for decreasing the birefringence of at least one starting halogenated optical material of claim 1 further comprising:
   said large area electron beam irradiating a first sub-layer of said at least one starting halogenated optical material under tensile stress, and
   control means to control the large area electron beam to decrease the birefringence of said first sub-layer of said at least one starting halogenated optical material under tensile stress with the remaining second sub-layer of said at least one starting halogenated optical material retaining its original birefringence.

12. The apparatus for decreasing the birefringence of at least one starting halogenated optical material of claim 11 wherein said large area electron beam partially penetrates said at least one starting halogenated optical material to form said first sub-layer.

13. A method for decreasing the birefringence of at least one starting halogenated optical material comprising:
   placing said at least one starting halogenated optical material under tensile stress
   irradiating said at least one starting halogenated optical material under tensile stress with a large area electron beam source, and
   controlling the energy of the electron beam source to decrease the birefringence of said at least one starting halogenated optical material under tensile stress.

14. The method for decreasing the birefringence of at least one starting halogenated optical material of claim 13 further comprising the step of:
   heating said at least one starting halogenated optical material under tensile stress during said irradiating said at least one starting halogenated optical material under tensile stress.

15. The method for decreasing the birefringence of at least one starting halogenated optical material of claim 14 wherein said heating can raise said temperature of said at least one starting halogenated optical material under tensile stress to between 10 degrees Celsius and 1000 degrees Celsius during said irradiating said at least one starting halogenated optical material under tensile stress.

16. The method for decreasing the birefringence of at least one starting halogenated optical material of claim 13 further comprising the step of:
   masking said at least one starting halogenated optical material under tensile stress to limit said irradiating said at least one starting halogenated optical material under tensile stress to a selected area on said at least one starting halogenated optical material under tensile stress.

17. The method for decreasing the birefringence of at least one starting halogenated optical material of claim 16 wherein said masking is done by an aperture mask.

18. The method for decreasing the birefringence of at least one starting halogenated optical material of claim 17 wherein said masking is done by an embossing structure.

19. The method for decreasing the birefringence of at least one starting halogenated optical material of claim 13 wherein the atmosphere during said irradiating said at least one starting halogenated optical material is between 1 milliTorr and 760 milliTorr.

20. The method for decreasing the birefringence of at least one starting halogenated optical material of claim 13 further comprising the step of:
   forming in said at least one starting halogenated optical material a decreased birefringence by creating additional bond structure in said at least one starting halogenated optical material under tensile stress.

21. The method for decreasing the birefringence of at least one starting halogenated optical material of claim 13 wherein said at least one starting halogenated optical material is a mixture of at least two different halogenated optical materials.

22. The method for decreasing the birefringence of at least one starting halogenated optical material of claim 13 wherein irradiating a first sub-layer of said at least one starting halogenated optical material under tensile stress with a large area electron beam source, and
   controlling the energy of the electron beam source to decrease the birefringence of said first sub-layer of said at least one starting halogenated optical material under tensile stress with the remaining second sub-layer of said at least one starting halogenated optical material retaining its original birefringence.

23. The method for decreasing the birefringence of at least one starting halogenated optical material of claim 22 wherein said large area electron beam partially penetrates said at least one starting halogenated optical material to form said first sub-layer.

* * * * *